(12) United States Patent
Hien et al.

(10) Patent No.: US 12,066,166 B2
(45) Date of Patent: Aug. 20, 2024

(54) OPTOELECTRONIC LIGHTING DEVICE AND METHOD FOR MANUFACTURING AN OPTOELECTRONIC LIGHTING DEVICE

(71) Applicant: OSRAM Opto Semiconductors GmbH, Regensburg (DE)

(72) Inventors: Matthias Hien, Kirchroth (DE); Sebastian Stigler, Scharmassing (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 496 days.

(21) Appl. No.: 17/311,862

(22) PCT Filed: Dec. 20, 2019

(86) PCT No.: PCT/EP2019/086649
§ 371 (c)(1),
(2) Date: Jun. 8, 2021

(87) PCT Pub. No.: WO2020/136117
PCT Pub. Date: Jul. 2, 2020

(65) Prior Publication Data
US 2022/0020731 A1    Jan. 20, 2022

(30) Foreign Application Priority Data
Dec. 28, 2018    (DE) .......................... 102018133655.1

(51) Int. Cl.
*F21V 14/02*    (2006.01)
*F21Y 113/13*    (2016.01)
(Continued)

(52) U.S. Cl.
CPC ............ *F21V 14/02* (2013.01); *H01L 33/005* (2013.01); *F21Y 2113/13* (2016.08); *F21Y 2115/10* (2016.08); *H01L 2933/0058* (2013.01)

(58) Field of Classification Search
CPC ............................... F21V 14/02; H01L 33/005
See application file for complete search history.

(56) References Cited

U.S. PATENT DOCUMENTS 7,740,365 B2    6/2010 Hüttner et al.
7,878,681 B2    2/2011 Blümmel et al.
(Continued)

FOREIGN PATENT DOCUMENTS

DE    102006002275 A1    7/2006
DE    102005042066 A1    3/2007
(Continued)

*Primary Examiner* — Bryon T Gyllstrom
(74) *Attorney, Agent, or Firm* — Slater Matsil, LLP

(57) ABSTRACT

In an embodiment an optoelectronic lighting device includes a support and at least one pixel having three illuminating elements, wherein the illuminating elements of the pixel are arranged on an upper side of the support, each illuminating element having a center point, wherein the illuminating elements are arranged around a central point lying on the upper side of the support such that the center points of the illuminating elements lie on a circular path with a defined radius revolving around the central point, wherein each illuminating element includes a base body with a quadrangular base surface, a corner of the base body of each illuminating element lying at least approximately on a line which extends between the center point of the respective illuminating element and the central point, and/or wherein each illuminating element includes a base body with a square base surface, the illuminating elements being arranged on the upper side of the support such that mutually opposite side surfaces of the base body of adjacent illuminating elements extend non-parallel to one another.

14 Claims, 2 Drawing Sheets

(51) Int. Cl.
*F21Y 115/10* (2016.01)
*H01L 33/00* (2010.01)

(56) References Cited

U.S. PATENT DOCUMENTS

| | | | | |
|---|---|---|---|---|
| 8,282,244 | B2 * | 10/2012 | Romelt | F21K 9/64 |
| | | | | 362/249.06 |
| 9,541,717 | B2 * | 1/2017 | Krabe | G02B 6/4231 |
| 9,557,041 | B2 * | 1/2017 | Chien | F21V 15/01 |
| 2004/0252736 | A1 | 12/2004 | Nakayama et al. | |
| 2005/0169007 | A1 | 8/2005 | Chou | |
| 2006/0226336 | A1 * | 10/2006 | York | G02B 6/4298 |
| | | | | 250/206 |
| 2010/0166407 | A1 * | 7/2010 | Iwanaga | G03B 15/05 |
| | | | | 362/11 |
| 2011/0116266 | A1 * | 5/2011 | Kim | F21K 9/65 |
| | | | | 362/249.02 |
| 2012/0250323 | A1 * | 10/2012 | Velu | F21V 29/00 |
| | | | | 257/E33.056 |
| 2013/0095585 | A1 * | 4/2013 | Chen | H01L 33/005 |
| | | | | 438/29 |
| 2017/0268740 | A1 | 9/2017 | Boenigk | |
| 2018/0233492 | A1 | 8/2018 | Liu et al. | |

FOREIGN PATENT DOCUMENTS

| | | |
|---|---|---|
| DE | 102008038778 | 2/2010 |
| DE | 102016204181 A1 | 9/2017 |
| DE | 202017106116 U1 | 11/2017 |
| EP | 1994560 A1 | 11/2008 |
| JP | 2011253158 A | 12/2011 |
| WO | 2016142179 A1 | 9/2016 |

* cited by examiner

OPTOELECTRONIC LIGHTING DEVICE AND METHOD FOR MANUFACTURING AN OPTOELECTRONIC LIGHTING DEVICE

This patent application is a national phase filing under section 371 of PCT/EP2019/086649, filed Dec. 20, 2019, which claims the priority of German patent application 10 2018 133 655.1, filed Dec. 28, 2018, each of which is incorporated herein by reference in its entirety.

TECHNICAL FIELD

The present invention relates to an optoelectronic lighting device having a carrier and at least one pixel, which has three lighting elements, in particular LEDs (LED=Light Emitting Diode).

BACKGROUND

In the case of optoelectronic lighting devices which are integrated, for example, in an interior element of a motor vehicle, it is desirable if these can be designed to be particularly compact.

SUMMARY

Embodiments provide an optoelectronic lighting device that can be designed compactly.

An optoelectronic lighting device comprises a carrier and at least one pixel which has three luminous elements, in particular LEDs, the luminous elements of the pixel being arranged on the upper side of the carrier and each luminous element having a center point, and the luminous elements being arranged around an imaginary central point lying on the upper side of the carrier in such a way that the center points of the luminous elements lie on an imaginary circular path with a defined radius running around the central point.

By arranging the lighting elements on the upper side of the support in such a way that the centers of the lighting elements lie on the circular path revolving around the central point, the lighting elements can be arranged particularly close to one another—with appropriate selection of the radius or diameter of the circular path. Each lighting element can be fixed to the upper surface of the carrier with an adhesive material that is initially flowable and then cures. In this case, in particular due to the arrangement of the lighting elements, creeping of adhesive material onto a lighting element can be avoided even if the lighting elements are relatively close to each other, without having to provide, for example, a groove or the like on the upper side of the carrier to accommodate excess adhesive material.

Each light point may have a base body, in particular a cuboid, with a square base surface. A respective imaginary diagonal in the base surface can extend between respective opposite corners of the base surface or the base body. The base surface thereby runs in a plane which extends parallel to the lower side or upper side of the base body.

The radius of the circular path can correspond to at least half the length of the diagonals. This can ensure that the lighting elements can be arranged around the central point so that the centers of the lighting elements lie on the circular path. The center point of a respective lighting element can be defined by the intersection of the diagonals.

The radius of the circular path can be the sum of half the length of the diagonal and a predetermined safety distance. In particular, the safety distance allows the illuminating elements to be arranged around the center point along the circular path without colliding with each other.

The safety distance can be in the range between 0 μm and 60 μm. For example, the safety distance can be at least approximately 10 μm, 20 μm, 30 μm, 40 μm, 50 μm or 60 μm.

Each illuminating element can have a base body, in particular a cuboid or cube-shaped base body, with a square base surface, wherein one corner of the base body of each illuminating element lies at least approximately on an imaginary line which runs between the center point of the respective illuminating element and the central point. The illuminating elements are thus arranged on the upper side of the carrier in a twisted manner compared to a conventional arrangement. In particular, a respective corner of an illuminating element points to the central point. This results in a relatively large free space between the illuminating elements, despite the compact, closely spaced arrangement of the illuminating elements. Creeping up of not yet cured adhesive material, which is used for fastening the illuminating elements to the carrier, can thus be avoided.

In the case of illuminating elements, the foregoing arrangement in which a corner of the base body of each illuminating element lies on an imaginary line extending between the center of the respective illuminating element and the central point may correspond to a 120° rotation of an illuminating element about the central point and with respect to an adjacent illuminating element.

Each illuminating element can have a base body with a quadrangular base surface, wherein the illuminating elements are arranged on the upper side of the carrier in such a way that mutually opposing side surfaces of the base body of adjacent illuminating elements are not parallel to one another. Each illuminating element can thus be rotated, for example with respect to an adjacent illuminating element. The axis of rotation preferably runs through the central point and perpendicular to the upper side of the support. A respective rotation of the illuminating elements by 120° relative to each other can thus be realized.

The illuminating elements can be evenly spaced as seen in the circumferential direction of the circular path. A uniform distribution of the illuminating elements around the central point and along the circumferential direction of the circular path can thus be realized.

The illuminating elements can be attached or glued to the upper side of the carrier.

The optoelectronic illuminating device can further comprise an optical fiber into which the light emitted by the illuminating elements can be coupled. It can be provided that the end of the optical fiber intended for coupling in is arranged at a distance above the illuminating elements.

An optical element, such as a lens, can optionally be provided between the end of the illuminating fiber and the illuminating elements, in particular to increase the coupling efficiency into the illuminating fiber.

In particular, the optical fiber may be arranged above the illuminating elements such that an imaginary longitudinal axis of the light axis passes at least substantially through the central point. The end of the optical fiber intended for coupling in is thus centered above the illuminating elements. Uniform coupling of the respective light emitted by the three illuminating elements can thus be realized in a simple manner.

The optoelectronic light-emitting device can have a marking, in particular formed on the upper side of the carrier. The carrier may be, for example, a lead frame in which the marking is located at a point where non-conductive insulation has been removed. The marking may thus be formed by a metallic region, in particular a copper region, surrounded by insulating material. The marking can not only be a point marking, but also other shapes are possible, such as a cross-shaped marking or a marking consisting of several points or a combination of points and lines.

The marking can be used to determine a nominal position of an imaginary central point and/or a respective nominal position for the positioning of the central points of the light elements. A machine, which for example arranges the illuminating elements on the upper side of the carrier, can be designed to recognize the marking and to determine fully automatically on the basis of the marking a desired position of the central point and/or respective desired positions for the positioning of the centers of the illuminating elements. The machine can then arrange the illuminating elements on the carrier in the corresponding manner and, if necessary, wire them.

A method for manufacturing an optoelectronic lighting device comprises the following steps:
  formation of a mark on the upper side of a support,
  determining an imaginary central point on the upper side of a carrier, in particular using at least one predetermined rule, and starting from the marking,
  starting from the marking and/or the central point and in particular using at least one further predetermined rule, determining three imaginary position points for three illuminating elements of a pixel in such a way that the three position points lie on an imaginary circular path with a defined radius running around the central point,
  arranging the three light points on the upper side of the carrier in such a way that in each case a center point of a light element is arranged on in each case one of the three position points.

Such a method can be carried out, for example, by a machine already mentioned above for arranging the light elements on a carrier, such as a ladder frame. The rule for determining the central point from the marking can, for example, specify co-ordinates indicating the position of the central point in relation to the marking. Using these coordinates, the machine can then determine the imaginary central point based on the mark.

The rule for determining the three imaginary position points for the three illuminating elements of a pixel can include, for example, that the three illuminating elements are evenly spaced from each other as seen in the circumferential direction of the circular path.

According to a further development of the method, by means of the marking and/or the central point, one end of an illuminating fiber can be arranged at a distance above the illuminating elements in such a way that an imaginary longitudinal axis of the illuminating fiber passes at least substantially through the central point. The optical fiber can therefore be arranged above the illuminating elements in such a way that the optical fiber is centrally located above the illuminating elements. Uniform coupling of the light emitted by the illuminating elements into the optical fiber can thus be achieved.

According to a further development of the method, each light spot can have a base body with a quadrangular, in particular square or rectangular, base area, where a respective imaginary diagonal extends between in each case two opposite corners, and where the radius of the circular path is defined in such a way that it is at least equal to or greater than half the length of the diagonal. In the method, the radius of the circular path may be defined such that it is equal to the sum of half the length of the diagonal and a predetermined safety distance.

In the method, it can be provided in particular that the illuminating elements, viewed in the circumferential direction of the circular path, are arranged on the support at a uniform distance from one another.

It may be provided that the illuminating elements are arranged such that a corner of the base body of each illuminating element lies at least approximately on an imaginary line extending between the center point of the respective illuminating element and the central point. It can also be provided that the illuminating elements are arranged on the upper side of the support in such a way that side surfaces of the base body of adjacent illuminating elements facing each other are not parallel to each other.

BRIEF DESCRIPTION OF THE DRAWINGS

The invention is described below by way of example with reference to the accompanying drawings.

DETAILED DESCRIPTION OF ILLUSTRATIVE EMBODIMENTS

Figure 1:
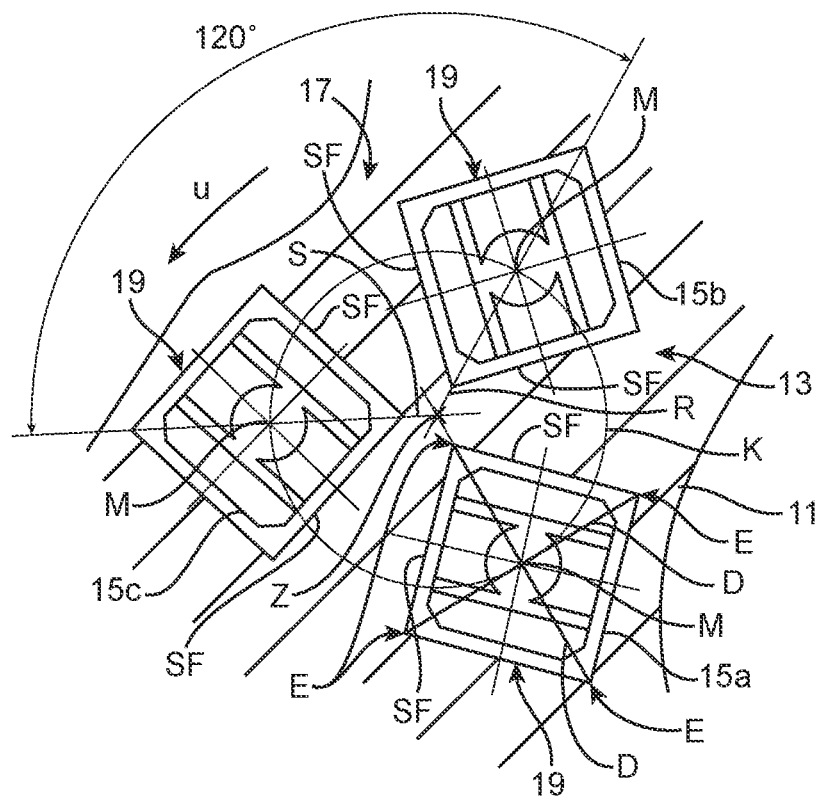
FIG. 1 shows a top view of a variant of an optoelectronic device.
Figure 2:
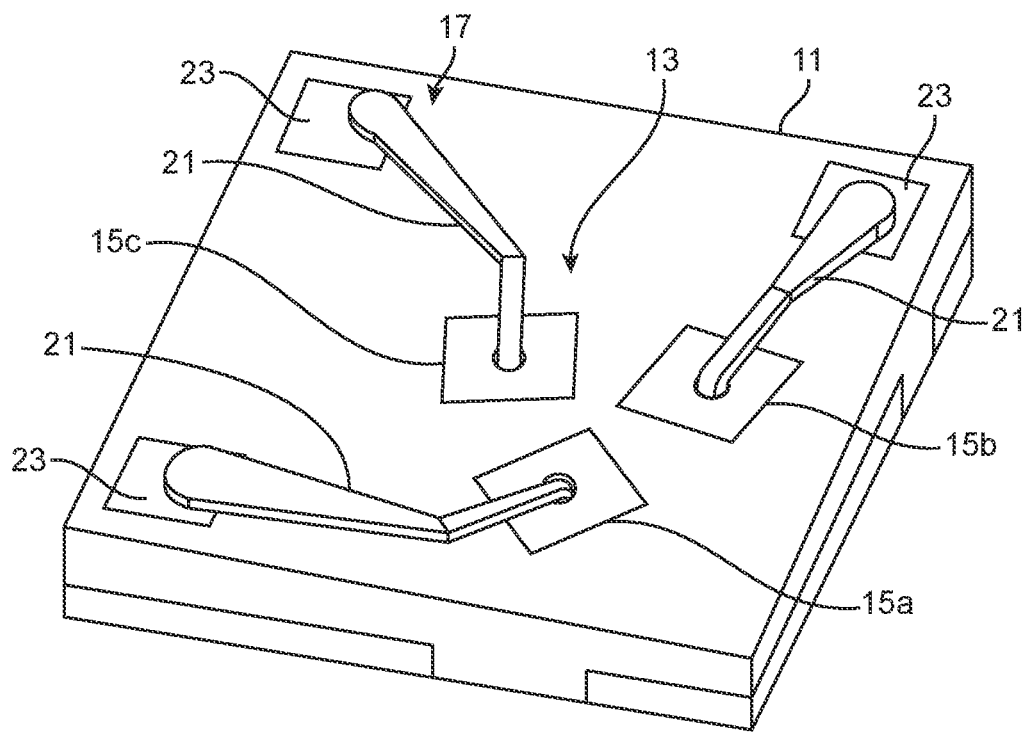
FIG. 2 shows a perspective view of the device of FIG. 1.

The optoelectronic illuminating device shown in FIGS. 1 and 2 comprises a support 11, for example a lead frame, and at least one pixel 13, which in the example shown is designed as an RGB pixel and which has three illuminating elements 15a, 15b and 15c. Each illuminating element 15a, 15b and 15c is designed as an LED. To realize the RGB pixel, one of the illuminating elements can emit blue light, one of the illuminating elements can emit red light, and one of the illuminating elements can emit green light. RGB stands for red, green and blue, and by controlling the illuminating elements 15a, 15b and 15c individually in a manner known per se, different colors can be realized according to the RGB color model.

In the optoelectronic illuminating device of FIGS. 1 and 2, the illuminating elements 15a, 15b and 15c of the pixel 13 are arranged on the upper side 17 of the support 11. Each luminous element 15a, 15b and 15c has a center point M. Furthermore, the illuminating elements 15a, 15b, 15c are arranged around an imaginary central point Z located on the upper side 17 of the support 11 in such a way that the center points M of the illuminating elements 15a, 15b and 15c lie on an imaginary circular path K with a defined radius R, which circulates around the center point Z.

Each illuminating element has a base body 19 with a square, here square, base surface. A respective imaginary diagonal D extends between each two opposite corners of the base body 19.

The center M of a respective illuminating element 15a, 15b and 15c is defined by the point of intersection of the diagonals D. Furthermore, the radius R of the circular path K may correspond to at least half the length of the diagonal D. Preferably, the radius R of the circular path K corresponds to the sum of half the length of the diagonal D and a predetermined safety distance S. If the safety distance S is greater than 0, it results in the corners of the illuminating elements 15a, 15b and 15c facing the central point Z not touching each other at the central point Z, but being spaced apart from it in accordance with the safety distance S. The safety distance S can be 40 μm, for example, although other values, for example in the range between 0 μm and 60 μm, are also possible.

As can be seen in FIG. 1, the illuminating elements 15a, 15b and 15c are arranged in such a way that the corner E of the respective illuminating element facing the central point Z lies at least approximately on an imaginary line extending between the center point M of the respective illuminating element and the central point Z. The illuminating elements 15a, 15b and 15c are arranged in such a way that the corner E of the respective illuminating element facing the central point Z lies at least approximately on an imaginary line extending between the center point M of the respective illuminating element and the central point Z. Furthermore, the illuminating elements 15a, 15b and 15c are arranged in such a way that opposing side surfaces SF of the base body 19 of adjacent illuminating elements 15a, 15b and 15c are not parallel to each other. Furthermore, the illuminating elements 15a, 15b and 15c are equally spaced from each other as seen in the circumferential direction U of the circular path.

In particular, the illuminating elements 15a, 15b and 15c may be arranged on the support 11 in such a way that, for example, the first illuminating element 15a is aligned such that the corner E facing the central point Z lies on an imaginary line extending between the center M of the first illuminating element 15a and the central point Z. The second illuminating element 15b may be arranged so as to be rotated with respect to the first illuminating element 15a by at least substantially 120° about the central point Z. Similarly, the third illuminating element 15c may be arranged to be rotated a further 120° about the central point Z from the second illuminating element 15b.

For fixing the illuminating elements 15a, 15b and 15c to the upper side 17 of the support 11, the illuminating elements can be attached or glued on by means of an adhesive. By arranging the illuminating elements 15a, 15b and 15c along the circumferential direction U of the circular path K, as shown in FIG. 1, a relatively large free space is created between the illuminating elements 15a, 15b and 15c, whereby creeping up of the adhesive on the lateral outer surfaces of the illuminating elements can be avoided and, in particular, an at least partial covering of the light emission surfaces located on the upper side of the illuminating elements can be avoided. In particular, the configuration shown in FIG. 1 permits a more compact arrangement of the illuminating elements 15a, 15b and 15c, especially, for example, in comparison with an arrangement of the illuminating elements in which the centers M of the illuminating elements form a triangle and mutually opposite side surfaces of the base body 19 are aligned parallel to one another (cf. FIG. 3). In this case, a minimum distance of approximately 60 μm between the opposing, parallel side surfaces is possible, especially if a T-slot is etched into the support 11 for receiving excess adhesive to prevent the adhesive from creeping up onto the upper surfaces of the illuminating elements.

The arrangement of the illuminating elements 15a, 15b and 15c in the configuration shown in FIGS. 1 and 2 can be done by machine. The attachment of an electrical conductor 21 to the upper side of a respective illuminating element in order to connect it electrically to a respective contact point 23 on the upper side of the support 11 can also be carried out by machine. In the arrangement of the illuminating elements 15a,15b,15c according to FIGS. 1 and 2, the minimum possible distance may be limited by the accuracy of the machine arrangement.

Figure 6:
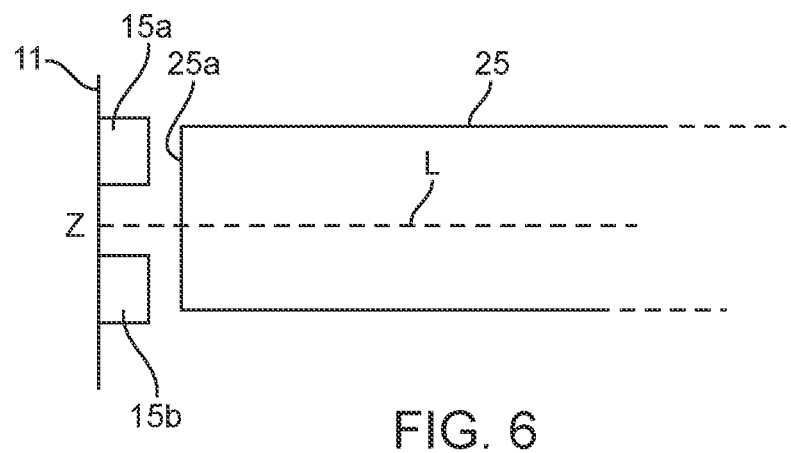
FIG. 6 shows a lateral, sectional view of the optoelectronic lighting device of FIG. 1 with an optical fiber.

As shown with reference to FIG. 6, the optoelectronic illuminating device may further comprise an optical fiber 25, one end 25a of the optical fiber 25 being arranged at a distance above the illuminating elements 15a, 15b and 15c. An imaginary longitudinal axis L of the optical fiber extends at least substantially perpendicularly through the central point Z. The optical fiber 25 is thus centrally located above the illuminating elements 15a, 15b and 15c, so that a particularly efficient and uniform coupling of the light emitted by the three illuminating elements 15a, 15b and 15c is possible. The illuminating elements 15a, 15b and 15c are preferably designed as surface emitters so that they have a light emission surface on their upper side. The upper sides of the illuminating elements face the end 25a of the optical fiber 25.

Figure 3:
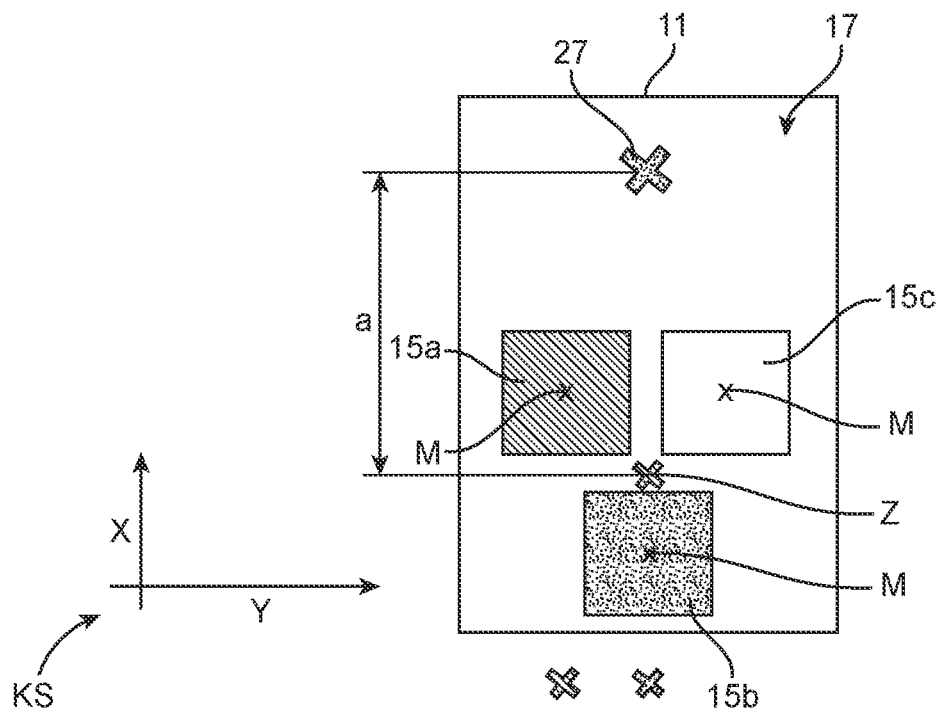
FIG. 3 shows an illustration of a variant of a method for manufacturing an optoelectronic lighting device.

FIG. 3 serves to illustrate a method for manufacturing an optoelectronic lighting device, for example a lighting device according to FIGS. 1 and 2. In the method, a marking 27 is formed on the upper side 17 of a carrier 11.

The marking may, for example, be cross-shaped, as shown in FIG. 3. The support 11 may be a ladder frame, for example. In this respect, the marking 27 may be exposed copper surrounded by an unremoved surrounding isoliberal layer. The marking 27 may, for example, be automatically detected by a machine for applying the illuminating elements 15a, 15b and 15c. The marking 27 can then be used by the machine to determine a desired position of an imaginary central point Z and/or a respective desired position for positioning the center points M of the illuminating elements 15a, 15b and 15c.

In particular, the method may provide that the central point Z is determined from the marking 27 by means of a predetermined rule. For example, a coordinate system KS can be defined in the plane of the upper side 17 of the support 11. In coordinates of this coordinate system KS it can be indicated, for example, how the central point Z is displaced with respect to the marking 27. As shown in FIG. 3 by way of example, the central point Z can, for example, be displaced by the distance a along an X-direction relative to the marking 27.

In the method, starting from the marking 27 and/or the central point Z, a determination of three imaginary position points for the positioning of the center points M of the three illuminating elements 15a, 15b and 15c of a pixel of the optoelectronic device can be carried out, in particular by means of a further predetermined rule. The three position points are determined in such a way that they lie on a circular path K with a defined radius R around the central point Z (cf. FIG. 1).

Furthermore, the three illuminating elements 15a, 15b and 15c are arranged linearly on the upper side 17 of the support 11 in such a way that a center point M of each illuminating element 15a, 15b and 15c is arranged on one of the three position points.

By means of the marking 27 and/or the central point Z, an end 25a of an optical fiber 25 (cf. FIG. 6) can further be arranged at a distance above the illuminating elements 15a, 15b and 15c in such a way that a longitudinal axis L of the optical fiber 25 passes at least substantially through the central point Z.

Figure 4:
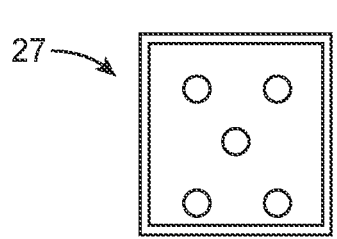
FIG. 4 shows an exemplary embodiment of a marking on a carrier of an optoelectronic light-emitting device.

As FIG. 4 illustrates, the marking 27 can be represented not only in a cross shape, but also by means of another symbol. For example, according to FIG. 4, the mark 27 may be represented as a "5" of a cube.

Figure 5:
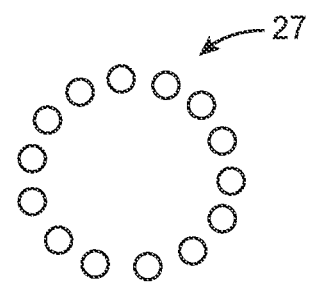
FIG. 5 shows a further exemplary embodiment of a marking on a carrier of an optoelectronic lighting device.

According to FIG. 5, the mark 27 may be formed by several small circles surrounding a center point in a circular manner.

Although the invention has been illustrated and described in detail by means of the preferred embodiment examples, the present invention is not restricted by the disclosed examples and other variations may be derived by the skilled person without exceeding the scope of protection of the invention.

The invention claimed is:

1. An optoelectronic lighting device comprising:
    a support; and
    at least one pixel having three illuminating elements,
    wherein the illuminating elements of the pixel are arranged on an upper side of the support, each illuminating element having a center point,
    wherein the illuminating elements are arranged around a central point lying on the upper side of the support such that the center points of the illuminating elements lie on a circular path with a defined radius revolving around the central point, and
    wherein each illuminating element comprises a base body with a quadrangular base surface, a corner of the base body of each illuminating element lying at least approximately on a line, which extends between the center point of the respective illuminating element and the central point.

2. The optoelectronic lighting device according to claim 1,
    wherein each illuminating element comprises a respective diagonal extending between in each case two opposite corners,
    wherein the radius of the circular path corresponds to at least half a length of the diagonal, and/or
    wherein the center of a respective light element is defined by an intersection of the diagonals.

3. The optoelectronic lighting device according to claim 2,
    wherein the radius of the circular path corresponds to a sum of half the length of the diagonal and a predetermined safety distance, and
    wherein the safety distance is in a range between 0 μm and 60 μm and/or is at least approximately 10 μm, 20 μm, 30 μm, 40 μm, 50 μm or 60 μm.

4. The optoelectronic lighting device according to claim 1, wherein the illuminating elements are uniformly spaced apart from one another as viewed in a circumferential direction of the circular path.

5. The optoelectronic lighting device according to claim 1, wherein the illuminating elements are adhered to or glued on the upper side of the support.

6. The optoelectronic lighting device according to claim 1, wherein the device comprises an optical fiber, one end of the optical fiber being arranged at a distance above the illuminating elements.

7. The optoelectronic lighting device according to claim 6, wherein a longitudinal axis of the optical fiber extends at least substantially through the central point.

8. The optoelectronic lighting device according to claim 1, wherein the device comprises a marking formed on the upper side of the support, and wherein the marking is preferably made of copper.

9. The optoelectronic lighting device according to claim 1, wherein the support comprises a T slot structure, and wherein the T slot structure is positioned such that a portion of the T slot structure is arranged between two illuminating elements and facing the central point while another portion of the T slot structure is positioned in an area of the support covered by the illuminating elements.

10. A method for manufacturing an optoelectronic lighting device, the method comprising:
    forming a marking on an upper surface of a support;
    starting from the marking, determining a central point by at least one first predetermined rule; and
    starting from the marking and/or the central point, by at least one second predetermined rule, determining three imaginary position points for three illuminating elements of a pixel such that the three position points lie on a circular path with a defined radius running around the central point,
    wherein the three illuminating elements are arranged on an upper side of the support such that in each case a center point of an illuminating element is arranged in each case on one of the three position points, and
    wherein each illuminating element comprises a base body with a quadrangular base surface, the illuminating elements being arranged such that a corner of the base body of each illuminating element lies at least approximately on a line which runs between the center point of the respective illuminating element and the central point.

11. The method according to claim 10, further comprising arranging, by the marking and/or the central point, one end of an optical fiber at a distance above the illuminating elements such that a longitudinal axis of the optical fiber runs at least substantially through the central point.

12. The method according to claim 10,
    wherein each illuminating element has a respective diagonal extending between in each case two mutually opposite corners, and
    wherein the radius of the circular path is defined such that it is at least equal to or greater than half a length of the diagonal.

13. The method according to claim 10,
    wherein the radius of the circular path is defined such that it corresponds to a sum of half a length of diagonals and a predetermined safety distance, and
    wherein safety distance is in range between 0 μm and 60 μm and/or is at least approximately 10 μm, 20 μm, 30 μm, 40 μm, 50 μm or 60 μm.

14. The method according to claim 10, wherein the illuminating elements, viewed in a circumferential direction of the circular path, are arranged uniformly spaced apart from one another on the support.

* * * * *

UNITED STATES PATENT AND TRADEMARK OFFICE
CERTIFICATE OF CORRECTION

| | |
|---|---|
| PATENT NO. | : 12,066,166 B2 |
| APPLICATION NO. | : 17/311862 |
| DATED | : August 20, 2024 |
| INVENTOR(S) | : Hien et al. |

It is certified that error appears in the above-identified patent and that said Letters Patent is hereby corrected as shown below:

In the Claims

In Column 8, in Claim 13, Line 54, delete "is in" and insert -- is in a --.

Signed and Sealed this
First Day of October, 2024

Katherine Kelly Vidal
*Director of the United States Patent and Trademark Office*